US009691620B2

(12) United States Patent
Toriumi et al.

(10) Patent No.: US 9,691,620 B2
(45) Date of Patent: Jun. 27, 2017

(54) SEMICONDUCTOR STRUCTURE HAVING FILM INCLUDING GERMANIUM OXIDE ON GERMANIUM LAYER AND METHOD OF FABRICATING THE SAME

(71) Applicant: Japan Science and Technology Agency, Kawaguchi-shi, Saitama (JP)

(72) Inventors: Akira Toriumi, Tokyo (JP); Choong-hyun Lee, Tokyo (JP)

(73) Assignee: Japan Science and Technology Agency, Kawaguchi-shi (JP)

( * ) Notice: Subject to any disclaimer, the term of this patent is extended or adjusted under 35 U.S.C. 154(b) by 0 days.

(21) Appl. No.: 14/423,627

(22) PCT Filed: Apr. 18, 2013

(86) PCT No.: PCT/JP2013/061542
§ 371 (c)(1),
(2) Date: Feb. 24, 2015

(87) PCT Pub. No.: WO2014/030389
PCT Pub. Date: Feb. 27, 2014

(65) Prior Publication Data
US 2015/0228492 A1  Aug. 13, 2015

(30) Foreign Application Priority Data

Aug. 24, 2012 (JP) .................................. 2012-185277

(51) Int. Cl.
*H01L 21/02* (2006.01)
*H01L 23/58* (2006.01)
(Continued)

(52) U.S. Cl.
CPC ...... *H01L 21/28255* (2013.01); *H01L 21/022* (2013.01); *H01L 21/02112* (2013.01);
(Continued)

(58) Field of Classification Search
CPC ......... H01L 21/28255; H01L 21/02112; H01L 21/02175; H01L 21/022; H01L 21/02236;
(Continued)

(56) References Cited

U.S. PATENT DOCUMENTS

2005/0142769 A1\* 6/2005 Kamata et al. ............... 438/287
2005/0189563 A1\* 9/2005 Lochtefeld et al. .......... 257/192
(Continued)

FOREIGN PATENT DOCUMENTS

JP  2010-219536 A  9/2010
JP  2012-209457 A  10/2012

OTHER PUBLICATIONS

Jan Felix Binder, "Electronic and Structure Properties of the Ge/GeO2 Interface through Hybrid Functionals" Ph.D Thesis No. 5363 (2012), pp. 73, Ecole Polytechnique Federale de Lausanne, Switzerland.\*

(Continued)

*Primary Examiner* — Dzung Tran
(74) *Attorney, Agent, or Firm* — Amster, Rothstein & Ebenstein LLP

(57) ABSTRACT

A semiconductor structure includes: a germanium layer 30; and an insulating film that has a film 32 that includes a germanium oxide and is formed on the germanium layer and a high dielectric oxide film 34 that is formed on the film including the germanium oxide and has a dielectric constant higher than that of a silicon oxide, wherein: an EOT of the insulating film is 2 nm or less; and on a presumption that an Au acting as a metal film is formed on the insulating film, a leak current density is $10^{-5 \times EOT+4}$ A/cm$^2$ or less in a case where a voltage of the metal film with respect to the germanium layer is applied from a flat band voltage to an accumulation region side by 1 V.

10 Claims, 14 Drawing Sheets

(51) Int. Cl.
  H01L 21/31 (2006.01)
  H01L 21/28 (2006.01)
  H01L 29/78 (2006.01)
  H01L 29/51 (2006.01)
  H01L 29/16 (2006.01)

(52) U.S. Cl.
  CPC .. H01L 21/02175 (2013.01); H01L 21/02236 (2013.01); H01L 21/02255 (2013.01); H01L 29/513 (2013.01); H01L 29/517 (2013.01); H01L 29/78 (2013.01); H01L 29/16 (2013.01)

(58) Field of Classification Search
  CPC ... H01L 21/316; H01L 29/513; H01L 29/517; H01L 29/78; H01L 29/516; H01L 29/16
  USPC ........... 257/411, 632, E21.19, 637; 438/591, 438/765, 703, 778, 287
  See application file for complete search history.

(56) References Cited

U.S. PATENT DOCUMENTS

| | | | |
|---|---|---|---|
| 2006/0289895 A1* | 12/2006 | Kamata | 257/192 |
| 2010/0176478 A1* | 7/2010 | Toriumi | H01L 21/28255 257/472 |
| 2010/0237444 A1* | 9/2010 | Lin | H01L 21/02175 257/411 |
| 2012/0049297 A1 | 3/2012 | Takeoka | |
| 2012/0112282 A1 | 5/2012 | Lin | |
| 2012/0248583 A1* | 10/2012 | Kabe | H01L 21/02236 257/632 |

OTHER PUBLICATIONS

R. Zhang et al, "Al2O3/GeOx/Ge gate stacks with low interface trap density fabricated by electron cyclotron resonance plasma postoxidation", Applied Physics Letters 98, 112902 (2011).*

Lee, C.H.. et al., "High-Electron-Mobility Ge/GeO2 n-MOSFETs with Two-Step Oxidation", IEEE Transactions on Electron Devices, vol. 58, No. 5, pp. 1295-1301 (May 2011), IEEE.

Toriumi, A. et al., "Material Potential and Scalability Challenges of Germanium CMOS", IEDM, pp. 28.4.1-28.4.4 (2011), IEEE.

Zhang, R. et al., "High Mobility Ge pMOSFETs with 0.7 nm Ultrathin EOT using HfO2/Al2O3/GeOx/Ge Gate Stacks Fabricated by Plasma Post Oxidation", Digest of Technical Papers—Symposium on VLSI Technology, 2012, pp. 161-162 (2012), IEEE.

Lee, C. H., et al., "Ge/GeO2 Interface Control with High-Pressure Oxidation for Improving Electrical Characteristics", Applied Physics Express [online], vol. 2, No. 7, pp. 071404-1~071404-3 (Jul. 10, 2009).

Jagadeesh Chandra, S. V., et al., "Effective metal work function of Pt Gate Electrode in Ge Metal Oxide Semiconductor Device", Journal of The Electrochemical Society, vol. 157, No. 5, pp. H546-H550 (Apr. 6, 2010).

Nishimura, T., et al., "High-Electron-Mobility Ge n-Channel Metal-Oxide-Semiconductor Field-Effect Transistors with High-Pressure Oxidized Y2O3", Applied Physics Express [online], vol. 4, Issue 6, pp. 064201-1~064201-3 (Jun. 2, 2011).

Zhang, R. et al., "1-nm-thick EOT high mobility Ge n- and p-MOSFETs with ultrathin GeO x/Ge MOS interfaces fabricated by plasma post oxidation", Technical Digest—International Electron Devices Meeting, IEDM, pp. 28.3.1~28.3.4. (Dec. 2011), IEEE.

Nakashima H. et al., "Electrical Characterization of High-k Gate Dielectrics on Ge with HfGeN and GeO2 Interlayers", IEICE Technical Report, pp. 51-56 (Jun. 2009), The Institute of Electronics, Information and Communication Engineers.

Kita, K. et al., "Significant Improvement of Electronic Characteristics of High-k/Ge MIS Capacitors by Controlling Interface Reactions", IEICE Technical Report, pp. 85-90 (Jun. 2007), The Institute of Electronics, Information and Communication Engineers.

Nakagawa H. et al., "Photoemission Study of HfO2/Ge(100) Stacked Structures", IEICE Technical Report, pp. 7-12. (Jun. 2006), The Institute of Electronics, Information and Communication Engineers.

Japan Patent Office, Notification of Reason(s) for Refusal, issued in PCT Patent Application No. PCT/JP2014/501328, mailed on Mar. 4, 2014, 4 pages.

European Patent Office, "Extended European Search Report," issued in European Patent Application No. 13 830 424.1, which is a European Counterpart of U.S. Appl. No. 14/423,627, with an issuance date of Mar. 15, 2016, 11 pages.

* cited by examiner

SEMICONDUCTOR STRUCTURE HAVING FILM INCLUDING GERMANIUM OXIDE ON GERMANIUM LAYER AND METHOD OF FABRICATING THE SAME

CROSS-REFERENCE TO RELATED APPLICATIONS

This application is a National Stage entry under 35 U.S.C. 371 of International Patent Application No. PCT/JP2013/061542, filed on Apr. 18, 2013, which claims the benefit of and priority to Japanese Patent Application No. 2012-185277, filed on Aug. 24, 2012, the entire contents of each of which are incorporated by reference herein.

TECHNICAL FIELD

The present invention relates to a semiconductor structure having a film including germanium oxide on a germanium layer and a fabricating method of the semiconductor structure.

BACKGROUND ART

Germanium (Ge) is a semiconductor that has better electrical properties than silicon (Si). However, germanium oxide (for example, $GeO_2$) is unstable. Therefore, germanium is hardly used as a semiconductor material forming a MOSFET (Metal Oxide Semiconductor Field Effect Transistor).

Non-patent documents 1 and 2 disclose that an interface condition between a germanium substrate and a germanium oxide film is improved when high pressure oxygen gas is used during forming the germanium oxide film on the germanium substrate.

PRIOR ART DOCUMENT

Non-Patent Document

Non-Patent Document 1: IEEE TRANSACTIONS ON ELECTRON DEVICES, VOL. 58, NO. 5, MAY 2011 pp. 1295-1301
Non-Patent Document 2: IEDM11-646-649 2011

SUMMARY OF THE INVENTION

Problem to be Solved by the Invention

When miniaturization of a gate length is performed, reduction of an EOT (Equivalent Oxide Thickness) of a gate insulating film is needed. In the methods of Non-Patent Documents 1 and 2, an interface condition between a germanium substrate and a germanium oxide film is preferable. However, a forming rate of the germanium oxide film is large. It is therefore difficult to form a thin germanium oxide film.

The present invention is directed to the above-mentioned problem. An object of the present invention is to create an interface condition between a germanium layer and a film including germanium oxide preferable and to form a film including thin germanium oxide.

Means for Solving the Problem

The present invention is directed to a semiconductor structure that includes: a germanium layer; and an insulating film that has a film that includes a germanium oxide and is formed on the germanium layer, and a high dielectric oxide film that is formed on the film including the germanium oxide and having a dielectric constant higher than that of a silicon oxide, wherein: an EOT of the insulating film is 2 nm or less; and when Au is acting as a metal film that is formed on the insulating film, a leak current density is $10^{-5 \times EOT+4}$ $A/cm^2$ or less when a voltage of the metal film with respect to the germanium layer is applied from a flat band voltage to an accumulation region side by 1 V. According to the present invention, it is possible to make an interface condition between a germanium layer and a film including germanium oxide preferable and form a film including thin germanium oxide.

In the above-mentioned structure, the high dielectric oxide film may include at least one of a hafnium oxide film, a zirconium oxide film, an aluminum oxide film, an yttrium oxide film, a scandium oxide film and an oxide film of a rare earth element.

In the above-mentioned structure, when Au is acting as the metal film formed on the insulating film, a capacitance value between the germanium layer and the metal film at a frequency of 50 kHz or more may decrease evenly or may be constant when the voltage of the metal film with respect to the germanium layer changes from the flat band voltage to an inversion region.

The above-mentioned structure may include a gate electrode on the high dielectric oxide film.

In the above-mentioned structure, $\log_{10}\mu_{\it eff}(cm^2/V \cdot s)$ may be more than $-0.59 \times \log_{10}N_s+10.19$ when $N_s$ is $5 \times 10^{12}$ $cm^{-2}$ or more in a case where the germanium layer is a p-type, a face current density in the germanium layer is $N_s$ ($cm^{-2}$) and an electron mobility of the germanium layer is $\mu_{\it eff}(cm^2/V \cdot s)$.

The present invention is also directed to a semiconductor structure including: a germanium layer; and a germanium oxide film that is formed on the germanium layer, has a density of 3.6 $g/cm^3$ or more and has an EOT of 2 nm or less. According to the present invention, it is possible to create an interface condition between a germanium layer and a film including germanium oxide preferable and form a film including thin germanium oxide.

In the above-mentioned structure, when Au is acting as a metal film formed on the germanium oxide film, a capacitance value between the germanium layer and the metal film at a frequency of 50 kHz or more may decrease evenly or may be constant when a voltage of the metal film with respect to the germanium layer changes from a flat band voltage to an inversion region.

The above-mentioned structure may include a gate electrode on the germanium oxide film.

The present invention is also directed to a method of fabricating of a semiconductor structure characterized by including: a process of forming a high dielectric oxide film on a germanium layer, a dielectric constant of the high dielectric oxide film being larger than that of a silicon oxide; and a process of forming a film including a germanium oxide between the germanium layer and the high dielectric oxide film by oxidizing the germanium layer through the high dielectric oxide film in an oxygen atmosphere under a condition that a partial pressure of the oxygen at room temperature is more than 1 atmosphere and a temperature of the germanium layer is less than 550 degrees C. According to the present invention, it is possible to create an interface condition between a germanium layer and a film including germanium oxide preferable and form a film including thin germanium oxide.

In the above-mentioned method, the condition may be that the partial pressure of the oxygen at the room temperature is more than 10 atmospheres and the temperature of the germanium layer is 520 degrees C. or less.

In the above-mentioned method, the high dielectric oxide film may include at least one of a hafnium oxide film, a zirconium oxide film, an aluminum oxide film, an yttrium oxide film, a scandium oxide film and an oxide film of a rare earth element.

The above-mentioned method may include a process of forming a gate electrode on the high dielectric oxide film.

The above-mentioned method may include a process of forming a gate electrode on the high dielectric oxide film, wherein: the condition may be that the partial pressure of the oxygen at the room temperature is more than 10 atmospheres and the temperature of the germanium layer is 520 degrees C. or less, and the high dielectric oxide film may be an yttrium oxide.

The present invention is also directed to a method of fabricating a semiconductor structure including a process of forming a germanium oxide film on the germanium layer by oxidizing an upper face of the germanium layer in an oxygen atmosphere under a condition that a partial pressure of the oxygen at room temperature is more than 1 atmosphere and a temperature of the germanium layer is less than 550 degrees C. According to the present invention, it is possible to make an interface condition between a germanium layer and a film including germanium oxide preferable and form a film including thin germanium oxide.

In the above-mentioned method, the condition may be that the partial pressure of the oxygen at the room temperature is more than 10 atmospheres and the temperature of the germanium layer is 520 degrees C. or less.

The above-mentioned method may include a process of forming a gate electrode on the germanium oxide film.

Effects of the Invention

According to the present invention, it is possible to create an interface condition between a germanium layer and a film including germanium oxide preferable and form a film including thin germanium oxide.

MODES FOR CARRYING OUT THE EMBODIMENTS

Figure 1A:
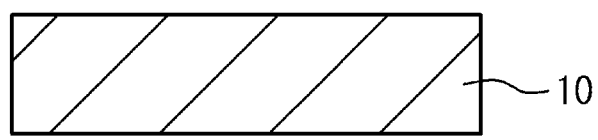
FIG. 1A, FIG. 1B, and FIG. 1C illustrate cross sectional views for describing a fabricating method of a semiconductor structure.
Figure 1B:
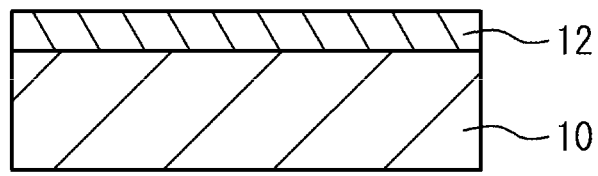
Figure 1C:
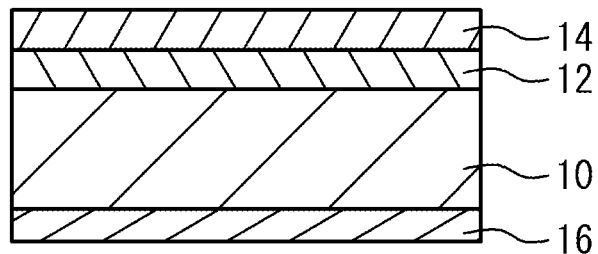

First, a description will be given of experiments performed by the present inventors. FIG. 1A to FIG. 1C illustrate cross sectional views for describing a fabricating method of a semiconductor structure. As illustrated in FIG. 1A, a germanium substrate 10 is prepared. The germanium substrate 10 is a p-type in which a main face is a (100) face, a dopant is gallium (Ga), and a dopant concentration is approximately $7 \times 10^{16}$ cm$^{-3}$. As illustrated in FIG. 1B, the germanium substrate 10 is subjected to a thermal oxidation in oxygen atmosphere, and thereby a germanium oxide film 12 is formed. As illustrated in FIG. 1C, an aluminum (Al) film acting as a metal film 16 is formed on a back face of the germanium substrate 10. A gold (Au) film acting as a metal film 14 is formed on a front face of the germanium oxide film 12. It is possible to correct a voltage applied to the metal film 14 in a case where a metal other than Au is used as the metal film 14 to a voltage in a case where a work function of the metal film 14 is used and Au is used as the metal film 14.

Figure 2A:
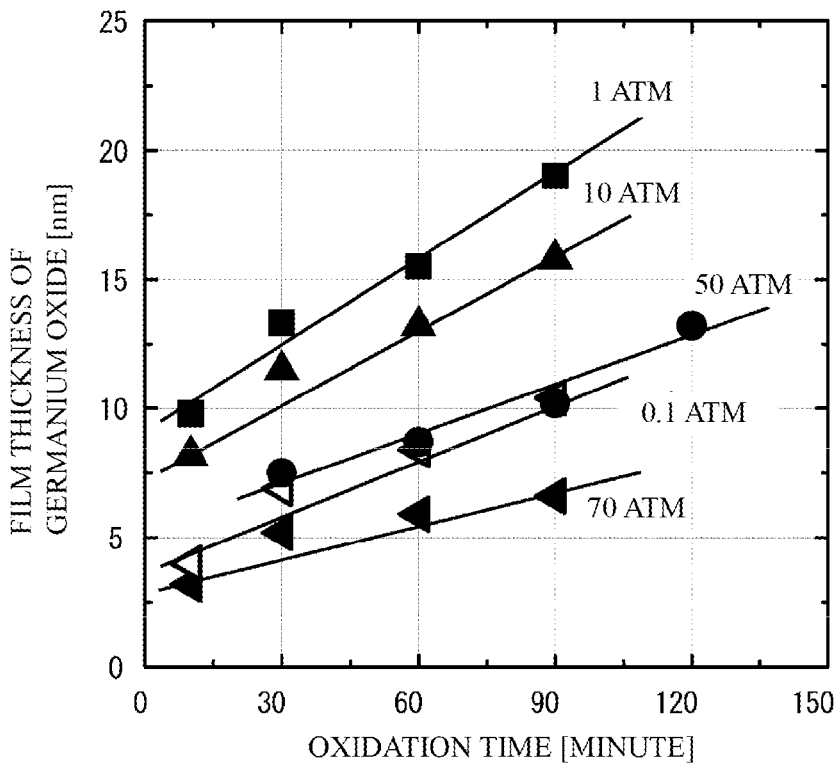
FIG. 2A illustrates a film thickness of a germanium oxide film with respect to a thermal process time.
Figure 2B:
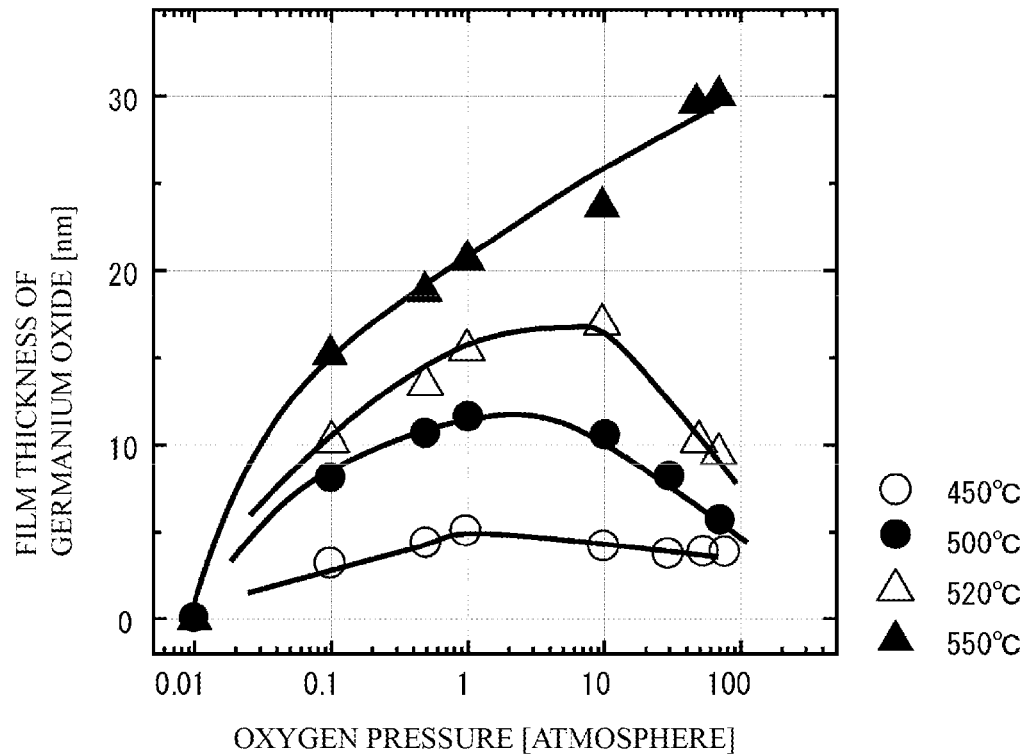
FIG. 2B illustrates a film thickness of a germanium oxide film with respect to an oxygen pressure.

In FIG. 1B, a temperature of the germanium substrate 10 (a substrate temperature) and a pressure of oxygen gas (oxygen pressure) are changed, and the germanium oxide film 12 is formed. FIG. 2A illustrates a film thickness of a germanium oxide film with respect to a thermal process time (oxidation time). FIG. 2B illustrates a film thickness of a germanium oxide film with respect to an oxygen pressure. In FIG. 2A, the substrate temperature is 500 degrees C. In FIG. 2B, the oxidation time is 30 minutes. The dots appearing in FIG. 2A and FIG. 2B indicate measurement points, and the straight line indicates an approximation line of the measurement points. The oxygen pressure is a pressure at room temperature (approximately 25 degrees C.). That is, samples were sealed with the above-mentioned oxygen pressure at room temperature. After that, the temperature was increased, and the thermal process was performed. Therefore, the gas pressure of the thermal process is higher than the above-mentioned gas pressure. The same applies the following experiments.

As illustrated in FIG. 2A, the film thickness of the germanium oxide film 12 increases as the oxidation time passes. An inclination of FIG. 2A corresponds to an oxidation rate. This is because oxygen diffuses in the germanium oxide film 12, and the oxygen oxidizes the upper face of the germanium substrate 10. The oxidation rate becomes higher under a condition that the oxygen pressure is 1 atmosphere than a condition that the oxygen pressure is 0.1 atmospheres. When the oxygen pressure is higher than 1 atmosphere, the oxidation rate becomes smaller as the oxygen pressure becomes higher.

As illustrated in FIG. 2B, when the substrate temperature is 550 degrees C., the film thickness of the germanium oxide film 12 increases as the oxygen pressure becomes higher. This corresponds to the fact that the oxidation rate increases as the oxygen pressure becomes higher. On the other hand, under a condition that the substrate temperature is 520 degrees C. or less, when the oxygen pressure is higher than 1 atmosphere or 10 atmospheres, the film thickness of the germanium oxide film 12 decreases as the oxygen pressure becomes higher.

When it is interpreted that the oxygen having diffused in the germanium oxide film 12 oxidizes the upper face of the germanium substrate 10, the oxidation rate is supposed to increase as the oxygen pressure gets higher. The above-mentioned interpretation cannot explain the phenomenon that the oxidation rate decreases as the oxygen pressure gets higher.

And so, in order to solve the above-mentioned phenomenon, an etching rate of the germanium oxide film 12 was measured. Samples of FIG. 1B were fabricated. The fabrication conditions are as follows.

Oxygen pressure: 70 atmospheres, and substrate temperature: 500 degrees C.
Oxygen pressure: 70 atmospheres, and substrate temperature: 550 degrees C.
Oxygen pressure: 1 atmosphere, and substrate temperature: 500 degrees C.

Figure 3A:
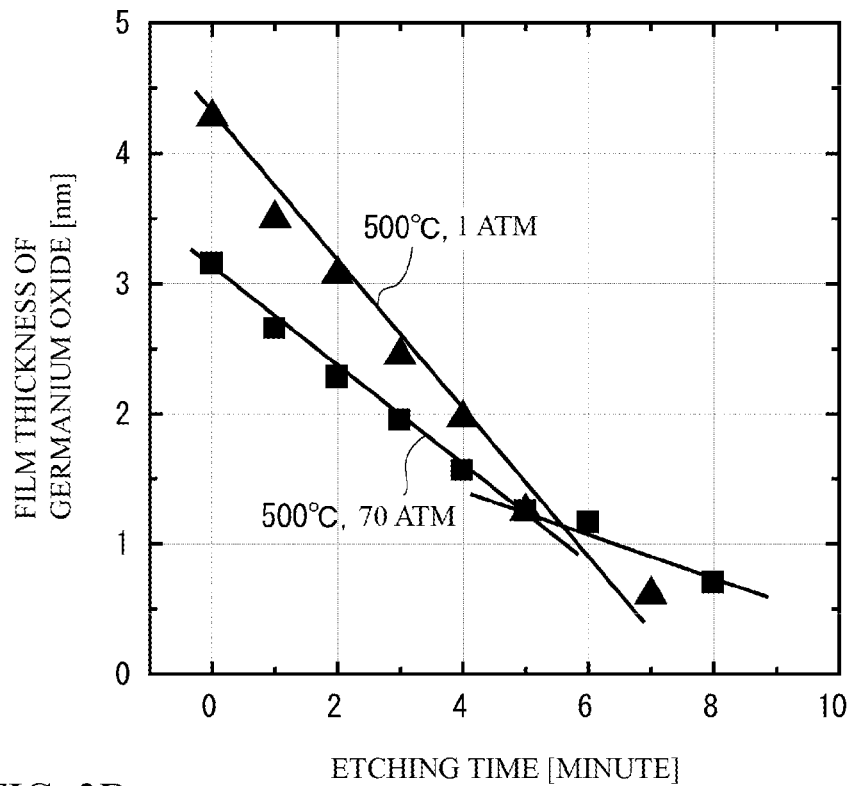
FIG. 3A and FIG. 3B illustrate a film thickness of germanium oxide with respect to an etching rate.
Figure 3B:
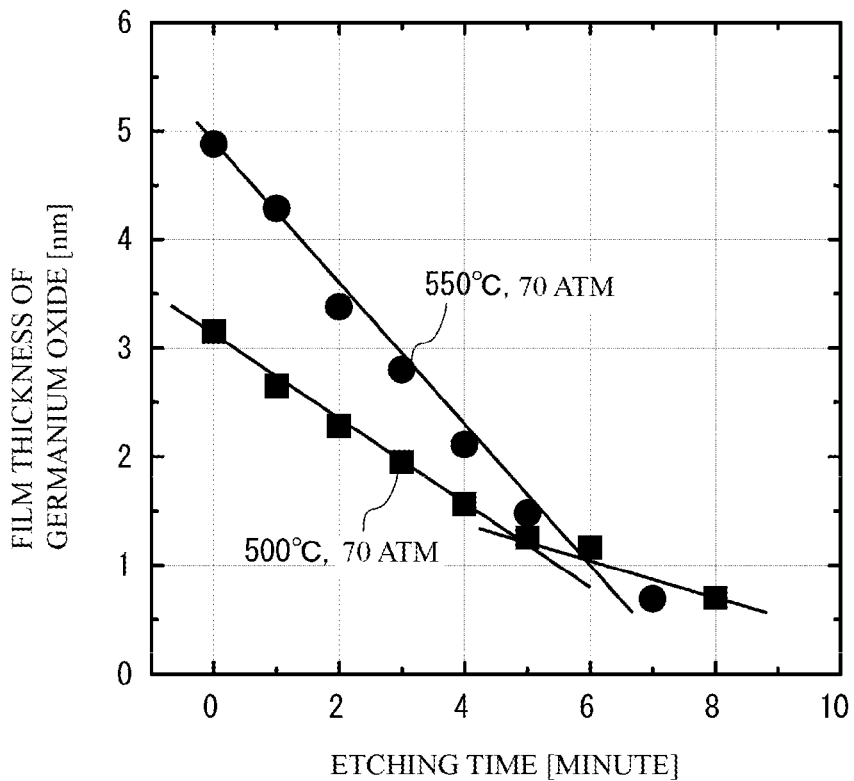

The samples were immersed in mixed liquid of ethyl alcohol ($C_2H_5OH$) and water ($H_2O$) with a ratio of 100:5, and the etching rate of the film thickness of the germanium oxide was measured. FIG. 3A and FIG. 3B illustrate the film thickness of the germanium oxide with respect to the etching rate. Dots indicate measurement points, and a straight line indicates an approximation line of the measurement points. Absolute values of the inclinations of FIG. 3A and FIG. 3B correspond to the etching rate. As illustrated in FIG. 3A, regarding the samples in which the substrate temperature is 500 degrees C. and the oxygen pressure is 1 atmosphere, the etching rate is approximately 0.56 nm/minute. Regarding the samples in which the substrate temperature is 500 degrees C. and the oxygen pressure is 70 atmospheres, the etching rate is approximately 0.37 nm/minute until five minutes of etching time. After the five minutes, the etching rate is approximately 0.19 nm/minute. As illustrated in FIG. 3B, regarding the samples in which the substrate temperature is 550 degrees C. and the oxygen pressure is 70 atmospheres, the etching rate is approximately 0.62 nm/minute.

Figure 4A:
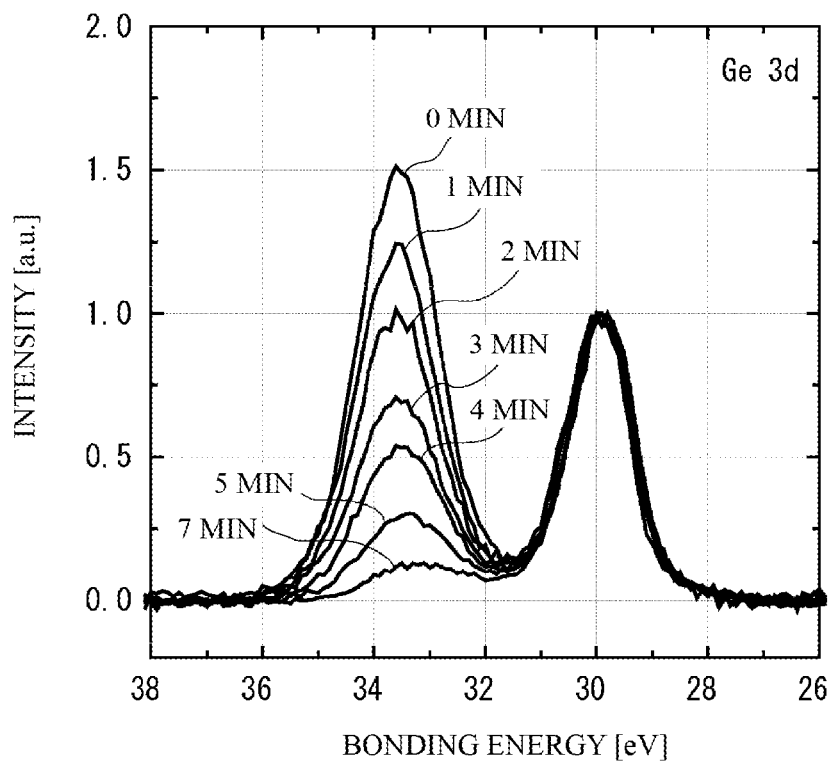
FIG. 4A and FIG. 4B illustrate signal intensity of samples in which oxygen pressures are 1 atmosphere and 70 atmospheres at room temperature, respectively, with respect to bonding energy.
Figure 4B:
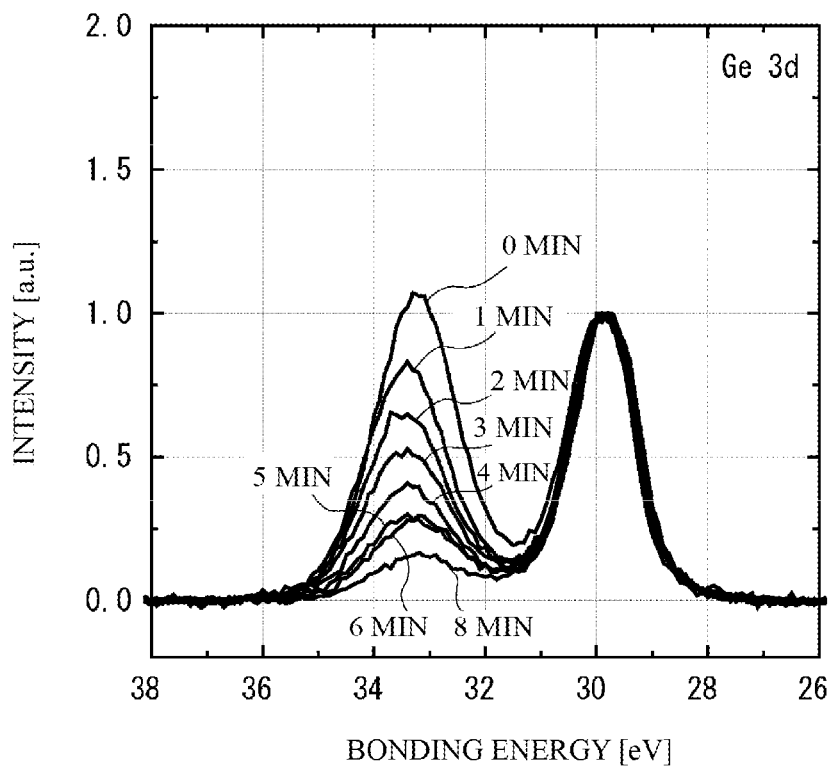

Every time of which the samples had a temperature of 500 degrees C. and the oxygen pressures were 1 atmosphere and 70 atmospheres were subjected to the etching, an XPS (X-ray Photoelectron Spectroscopy) measuring was performed. FIG. 4A and FIG. 4B illustrate signal intensity of the samples in which the oxygen pressures are 1 atmosphere and 70 atmospheres with respect to bonding energy, respectively. The bonding energy of Ge3d was measured. In FIG. 4A and FIG. 4B, peaks of approximately 30 eV correspond to the bonding energy between Ge and Ge. Peaks of approximately 33.5 eV correspond to the bonding of Ge and O.

As illustrated in FIG. 4A, regarding the samples in which the oxygen pressure is 1 atmosphere, when the germanium oxide film 12 is subjected to the etching from 0 minute to 7 minutes, a peak corresponding to the bonding between Ge and O is reduced. This indicates that the thickness of the germanium oxide film 12 is reduced because of the etching. However, a shifting of the peak energy is not observed. As illustrated in FIG. 4B, regarding the samples in which the oxygen pressure is 70 atmospheres, when the germanium oxide film 12 is subjected to the etching from 0 minute to 8 minutes, the peak corresponding to the bonding between Ge and O is reduced as in FIG. 4A. However, the shifting of the peak energy is not observed. Therefore, it is thought that there is no difference of the bonding energy of Ge and O between the samples in which the oxygen pressure is 1 atmosphere and the samples in which the oxygen pressure is 70 atmospheres.

Figure 5:
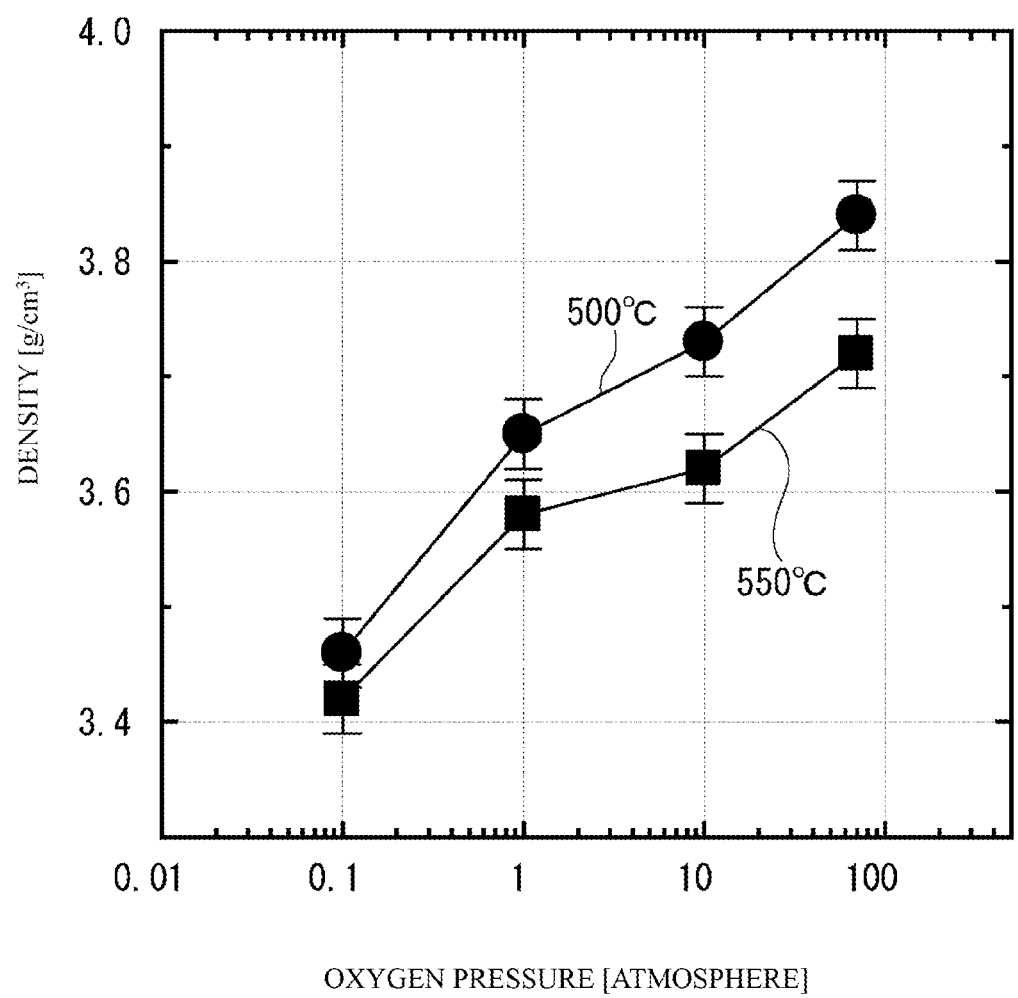
FIG. 5 illustrates a density of a germanium oxide film with respect to an oxygen pressure.

Next, fabricated samples were samples in which the substrate temperature was 500 degrees C., the film thickness was 5 nm and the oxygen pressure was changed and samples in which the substrate temperature was 550 degrees, the film thickness was 10 nm and the oxygen pressure was changed. The density of the germanium oxide film 12 of the fabricated samples was measured with use of a GIXR (Grazing Incidence X-ray Reflectivity) method. FIG. 5 illustrates the density of the germanium oxide film with respect to the oxygen pressure. Dots indicate measurement points. Straight lines connect the measurement points. Bars of an upper side and a down side indicate a measurement error. As illustrated in FIG. 5, with respect to the samples of the substrate temperatures of 500 degrees C. and 550 degrees C., when the oxygen partial pressure increases, the density of the germanium oxide film 12 increases. When the oxygen partial pressure is 0.1 atmospheres, the difference in density of the samples of the substrate temperatures of 500 degrees C. and 550 degrees C. is small. When the oxygen pressure is 10 atmospheres or more, the density difference between the samples of the substrate temperatures of 500 degrees C. and 550 degrees C. is large. The density of $GeO_2$ glass is generally 3.65 g/cm$^3$. Therefore, the density of the samples of the substrate temperature of 500 degrees C. is larger than that of general germanium oxide. It is thought that the etching rate of the samples is small in which the substrate temperature is 500 degrees C. and the oxygen pressure is 70 atmospheres in FIG. 3A and FIG. 3B because the density of the germanium oxide became large.

It is thought that the oxidation rate of the germanium oxide film 12 is small under the condition that the substrate temperature is 520 degrees C. or less and the oxygen pressure is 1 atmosphere or more in FIG. 2B because the density of the germanium oxide film 12 is large. It is thought that this is because the germanium oxide film 12 having large density is dense, and thereby the diffusion rate of the oxygen in the germanium oxide film 12 is small.

Next, samples of FIG. 1C were fabricated. The fabrication condition was as follows.

Oxygen pressure: 70 atmospheres, and substrate temperature: 500 degrees C.
Oxygen pressure: 70 atmospheres, and substrate temperature: 550 degrees C.
Oxygen pressure: 1 atmosphere, and substrate temperature: 500 degrees C.

Figure 6:
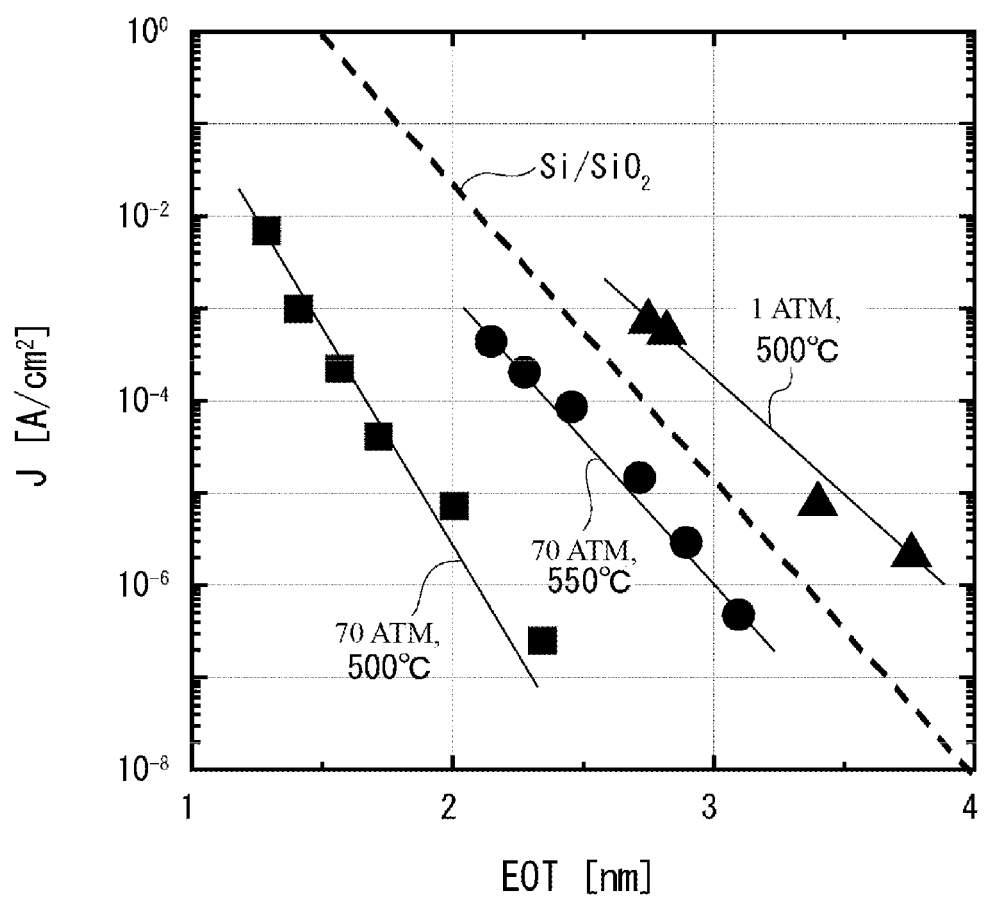
FIG. 6 illustrates a leak current with respect to an EOT.

FIG. 6 illustrates a leak current with respect to an EOT. The measurement temperature is room temperature. In FIG. 6, the EOT indicates an EOT of the germanium oxide film. The EOT can be converted from the saturated capacitance value of the C-V characteristic. The leak current density J is a leak current density between the metal film 16 and the metal film 14 in the case where the voltage of the metal film 14 with respect to the metal film 16 is −1 V from the flat band voltage. Dots indicate measurement points. Straight lines indicate approximation lines. A dotted line indicates the leak current density with respect to the EOT of the silicon oxide film formed on the silicon substrate.

As illustrated in FIG. 6, the oxidation rate of the samples in which the oxygen pressure is 1 atmosphere and the substrate temperature is 500 degrees C. is large. It is therefore difficult to form the germanium oxide film 12 of which EOT is 2.8 nm or less. The leak current of an identical EOT is larger than that of the silicon oxide film. The oxidation rate of the samples in which the oxygen pressure is 70 atmospheres and the substrate temperature is 550 degrees C. is large. It is therefore not possible to form the germanium oxide film 12 of which EOT is 2.2 nm or less. The leak current of an identical EOT is smaller than that of the silicon oxide film. However, when the EOT gets smaller, the leak current gets larger.

On the other hand, the oxidation rate of the samples in which the oxygen pressure is 70 atmospheres and the substrate temperature is 500 degrees C. is small. It is therefore possible to form the germanium oxide film 12 of which EOT is approximately 1.2 nm. And, the leak current density J can be $10^{-2}$ A/cm$^2$. This value is smaller than a silicon oxide film having the same EOT by approximately 3 digits.

Figure 7:
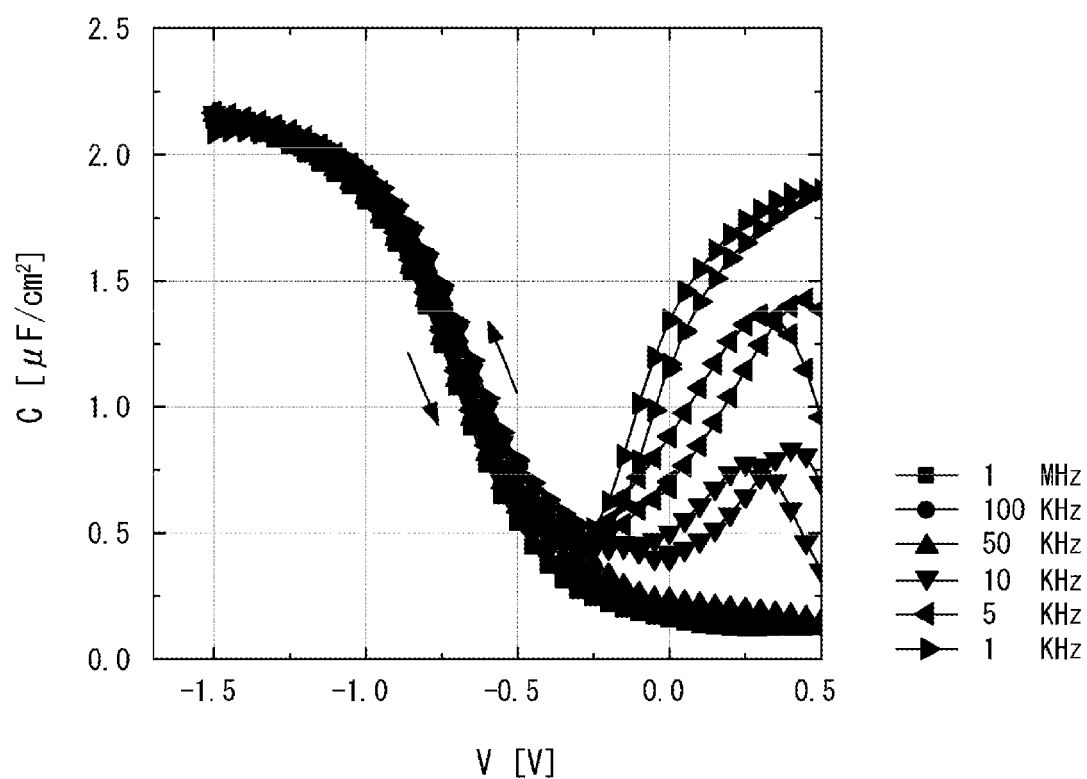
FIG. 7 illustrates a capacitance value C with respect to a voltage V.

When the C-V characteristic was measured with use of the samples in which the oxygen pressure was 70 atmospheres and the substrate temperature was 500 degrees C., the EOT was 1.2 nm. The C-V characteristic was measured by applying a voltage V to the metal film 14 with respect to the metal film 16. FIG. 7 illustrates a capacitance value C with respect to the voltage V. The measurement temperature is room temperature. The frequency at which the C-V characteristic was measured is 1 kHz to 1 MHz. As illustrated in FIG. 7, a hysteresis is hardly observed from the region in which the voltage V is minus (accumulation region) to the flat band voltage in which the capacitance value C is reduced. The frequency dependence is hardly observed. This indicates that there are extremely few defects in the germanium oxide film 12 and the interface state density on the valence band side of germanium between the germanium substrate 10 and the germanium oxide film 12 is extremely small.

Further, when the voltage is increased to the plus region (inversion region) from the flat band voltage, the capacitance hardly changes with respect to the voltage V and there is no frequency dependence in a region of which frequency is high (1 MHz, 100 kHz, 50 kHz). That is, when the voltage changes from the flat band voltage to the inversion region, the capacitance value between the germanium substrate 10 and the metal film 14 at the frequency of 50 kHz or more decreases evenly or is constant. For example, when the germanium oxide film 12 is formed at 1 atmosphere, the capacitance value at the frequency of 50 kHz or more increases from the flat band voltage to the inversion region as well as the case of the capacitance value at the frequency of 10 kHz or less of FIG. 7. From the result, it is understood that the interface state density on the conduction band of the germanium at the interface between the germanium substrate 10 and the germanium oxide film 12 is small and the interface condition is preferable, when the germanium oxide film 12 is formed at a high pressure.

As illustrated in FIG. 6 and FIG. 7, it is possible to reduce the EOT of the samples that are fabricated under the condition that the oxygen pressure is 70 atmospheres and the substrate temperature is 500 degrees C. And it is possible to make the interface condition preferable.

In the following, a description will be given of embodiments based on the above-mentioned experiments.

First Embodiment

Figure 8A:
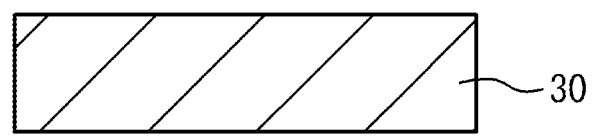
FIG. 8A and FIG. 8B illustrate cross sectional views for describing a fabricating method of a semiconductor structure in accordance with a first embodiment.
Figure 8B:
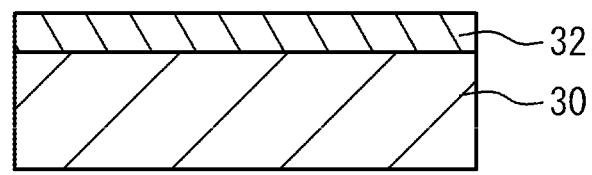

FIG. 8A and FIG. 8B illustrate cross sectional views for describing a fabricating method of a semiconductor structure in accordance with a first embodiment. As illustrated in FIG. 8A, a germanium layer 30 is prepared. The germanium layer 30 may be a single crystal germanium substrate or a germanium film formed on a substrate (for example, a silicon substrate). And, the germanium layer 30 may be a highly-pure germanium or may include an impurity. For example, the germanium layer 30 may be an n-type or a p-type germanium. Further, the germanium layer 30 may include some amounts of silicon that achieves the effect of the above-mentioned experiments. A composition ratio of the silicon may be 10 atomic % or less of the whole. A main face of the germanium layer 30 may be a (111) face or the like and may be another crystal face such as a (110) face or a (100) face.

As illustrated in FIG. 8B, a germanium oxide film 32 is formed on the germanium layer 30. The germanium oxide film 32 may be GeO$_2$ having a stoichiometric composition ratio or having a non-stoichiometric composition ratio. When the oxygen pressure is higher than 1 atmosphere in FIG. 2B, the forming rate of the germanium oxide film 32 can be smaller than that of the case of the 1 atmosphere. Thus, when the germanium oxide film 12 is formed with such oxidation temperature and such oxygen pressure, it is possible to reduce the EOT and make the interface condition preferable. Therefore, the germanium oxide film 32 oxidizes the upper face of the germanium layer 30 in oxygen atmosphere under a condition that the oxygen partial pressure at room temperature is larger than 1 atmosphere and the temperature of the germanium layer 30 is less than 550 degrees C. as illustrated in FIG. 2B. Thus, as illustrated in FIG. 6, it is possible to reduce the oxidation rate and form the germanium oxide film 32 having a small EOT with high controllability. And, as illustrated in FIG. 7, it is possible to make the interface condition between the germanium layer 30 and the germanium oxide film 32 preferable. In the experiments, 100% oxygen gas was used. However, mixed gas of oxygen gas and inert gas (for example, nitrogen gas, eighteenth group element gas such as helium, neon, argon, krypton, xenon or radon, or mixed gas of these) may be used. It is preferable that the oxygen partial pressure is 10 atmosphere or more. It is more preferable that the oxygen partial pressure is 30 atmospheres or more. It is preferable that the temperature is 520 degrees C. or less. It is more preferable that the temperature is 500 degrees C. or less. It is preferable that the oxidation temperature is 450 degrees C. or more in order to make the interface between the germanium layer 30 and the germanium oxide film 32 preferable. It is more preferable that the oxidation temperature is 470 degrees C. or more.

The germanium oxide film 32 formed in this manner can have a density of 3.6 g/cm$^3$ or more as illustrated in FIG. 5 and can have the EOT of 2 nm or less as illustrated in FIG. 6. It is preferable that the density is 3.65 g/cm$^3$ or more. It is more preferable that the density is 3.7 g/cm$^3$ or more. It is much more preferable that the density is 3.8 g/cm$^3$ or more. It is preferable that the EOT is 1.5 nm or less. It is more preferable that the EOT is 1.2 nm or less. It is much more preferable that the EOT is 1.0 nm or less.

Second Embodiment

Figure 9A:
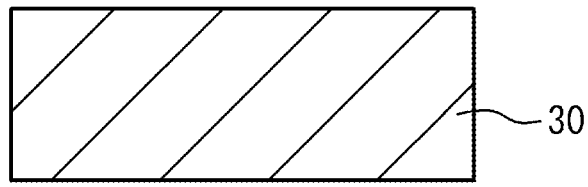
FIG. 9A, FIG. 9B, FIG. 9C, and FIG. 9D illustrate cross sectional views for describing a fabricating method of a semiconductor structure in accordance with a second embodiment.
Figure 9B:
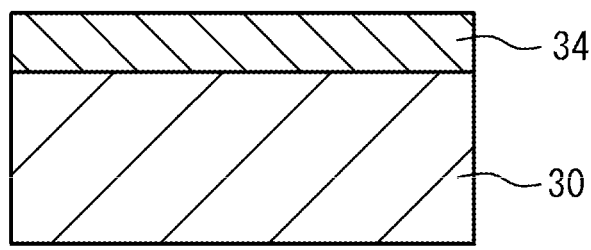

FIG. 9A to FIG. 9D illustrate cross sectional views for describing a fabricating method of a semiconductor structure in accordance with a second embodiment. As illustrated in FIG. 9A, the germanium layer 30 is prepared as described with respect to the first embodiment. As illustrated in FIG. 9B, a high dielectric oxide film 34 is formed on the germanium layer 30. The high dielectric oxide film 34 is a film having a dielectric constant higher than that of silicon oxide and is a film including at least one of a hafnium oxide film, a zirconium oxide film, an aluminum oxide film and an oxide film of a rare-earth element (for example, an yttrium oxide film or a scandium oxide film). For example, the high dielectric oxide film 34 may be one of the above-mentioned films or a film in which a plurality of above-mentioned films are laminated. The rare-earth element is scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or lutetium (Lu). The high dielectric oxide film 34 may have a stoichiometric composition ratio or a non-stoichiometric composition ratio. The high dielectric oxide film 34 is formed by a sputtering method or the like.

Figure 9C:
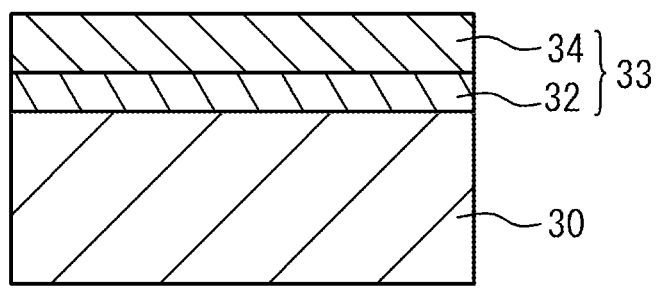

As illustrated in FIG. 9C, the high dielectric oxide film 34 is subjected to a thermal process in a high pressure oxygen atmosphere. Oxygen diffuses in the high dielectric oxide film 34 and oxidizes an upper face of the germanium layer 30. Thus, the germanium oxide film 32 is formed between the germanium layer 30 and the high dielectric oxide film 34. The germanium oxide film 32 and the high dielectric oxide film 34 form an insulating film 33. The germanium oxide film 32 may be $GeO_2$ having a stoichiometric composition ratio or having a non-stoichiometric composition ratio. Atomic elements of the high dielectric oxide film 34 may diffuse in the germanium oxide film 32. For example, the germanium oxide film 32 may be a mixed film of germanium oxide and metal oxide (oxide of a metal included in the high dielectric oxide film 34). In this manner, the germanium oxide film 32 may be a film including at least germanium oxide. The germanium oxide film 32 oxidizes the upper face of the germanium layer 30 in oxygen atmosphere under a condition that the oxygen partial pressure at room temperature is more than 1 atmosphere and the oxidation temperature of the germanium layer 30 is less than 550 degrees C. as well as the first embodiment. It is preferable that the oxygen partial pressure is 10 atmospheres or more. It is more preferable that the oxygen partial pressure is 30 atmospheres or more. It is preferable that the temperature is 520 degrees C. or less. It is more preferable that the temperature is 500 degrees C. or less. It is preferable that the oxidation temperature is 450 degrees C. or more. It is more preferable that the oxidation temperature is 470 degrees C. or more.

The high dielectric oxide film 34 has a high dielectric constant. It is therefore possible to reduce the EOT of the high dielectric oxide film 34. However, an interface state is formed at an interface between the germanium layer 30 and the high dielectric oxide film 34, and the interface condition is not preferable. And so, as illustrated in FIG. 9C, the upper face of the germanium layer 30 is oxidized through the high dielectric oxide film 34. Thus, the germanium oxide film 32 is formed. Oxygen diffuses in the high dielectric oxide film 34 more easily than the germanium oxide film 32. Therefore, it is possible to form the germanium oxide film 32 with the same condition as the first embodiment. Thus, it is possible to reduce the film thickness of the germanium oxide film 32 and make the interface condition between the germanium layer 30 and the insulating film 33 preferable, as well as the first embodiment.

Figure 9D:
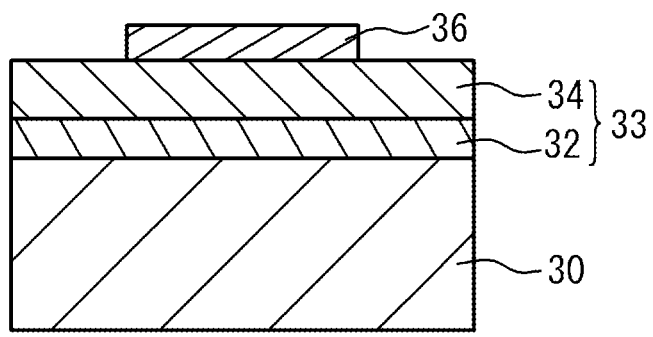

In the second embodiment, the p-type germanium substrate was used as the germanium layer 30, the yttrium oxide film was used as the high dielectric oxide film 34, and a semiconductor structure was fabricated. As illustrated in FIG. 9D, a metal film 36 (a gold film) was formed on the high dielectric oxide film 34. The film thickness of the high dielectric oxide film 34 is 1.5 nm. A forming condition of the germanium oxide film 32 is that the oxygen pressure is 70 atmospheres, the substrate temperature is 500 degrees C. and the oxidation time is one minute.

Figure 10:
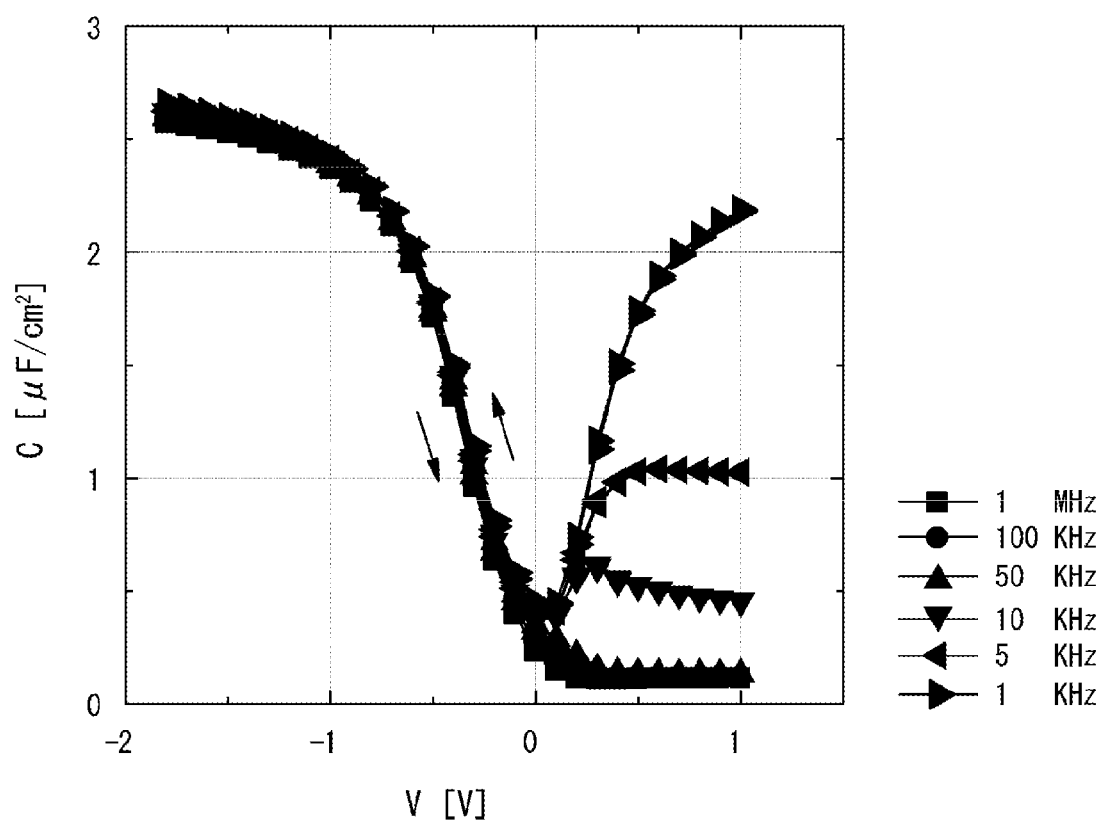
FIG. 10 illustrates a capacitance C with respect to a voltage V.

FIG. 10 illustrates the capacitance C with respect to the voltage V. The measurement temperature is room temperature. The frequency for measuring the C-V characteristic is 1 kHz to 1 MHz. As illustrated in FIG. 10, the hysteresis is hardly observed in a region where the voltage V increases and the capacitance C decreases (a region where an inversion layer is formed from the flat band). When the voltage is further increased from the flat band voltage to the inversion region, the capacitance value hardly changes with respect to the voltage V and there is no frequency dependence in the region having high frequencies (1 MHz, 100 kHz and 50 kHz). That is, when the voltage V changes from the flat band voltage to the inversion region, the capacitance value between the germanium substrate 10 and the metal film 14 at a frequency of 50 kHz or more decreases evenly or is constant. Thus, it is understood that there are few interface states at an interface between the germanium layer 30 and the insulating film 33, and the interface condition is.

Figure 11A:
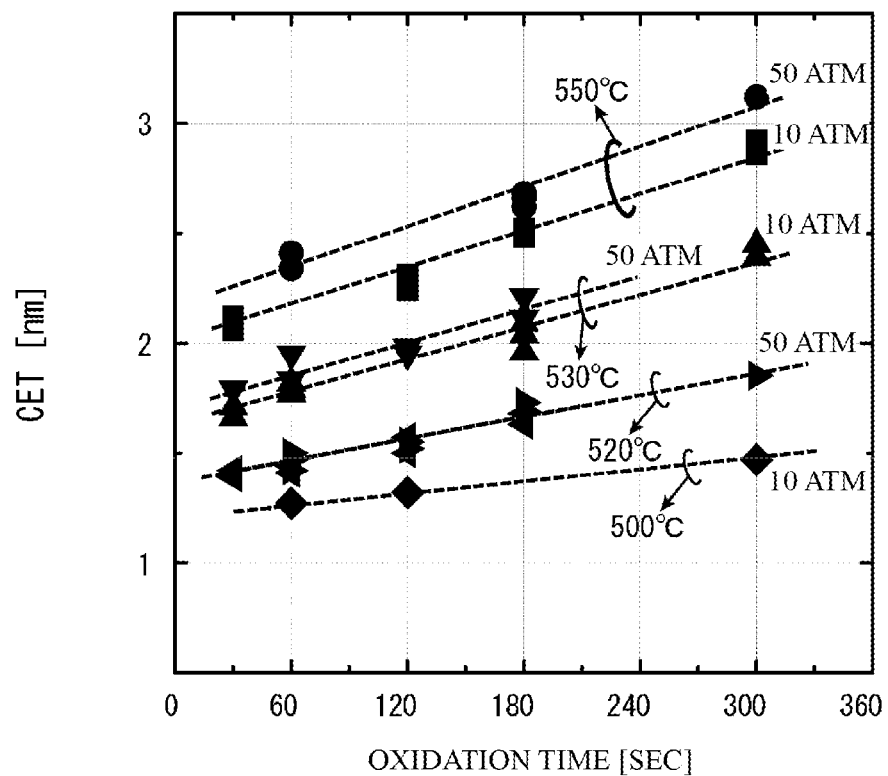
FIG. 11A illustrates a CET with respect to an oxidation time.

The forming condition of the germanium oxide film 32 was changed, and a CET (Capacitance Equivalent Thickness) with respect to the oxidation time was measured. FIG. 11A illustrates the CET with respect to the oxidation time. Dots are measurement points. Straight lines indicate lines connecting the dots. As illustrated in FIG. 11A, when the oxygen pressure is enlarged and the substrate temperature is reduced as well as FIG. 2A, the dependence of the CET with respect to the oxidation time is reduced and the control of the CET becomes easier. For example, it is possible to reduce the dependence of the CET with respect to the oxidation time under a condition that the substrate temperature is 530 degrees C. or less and the oxygen pressure is 10 atmospheres or less.

Figure 11B:
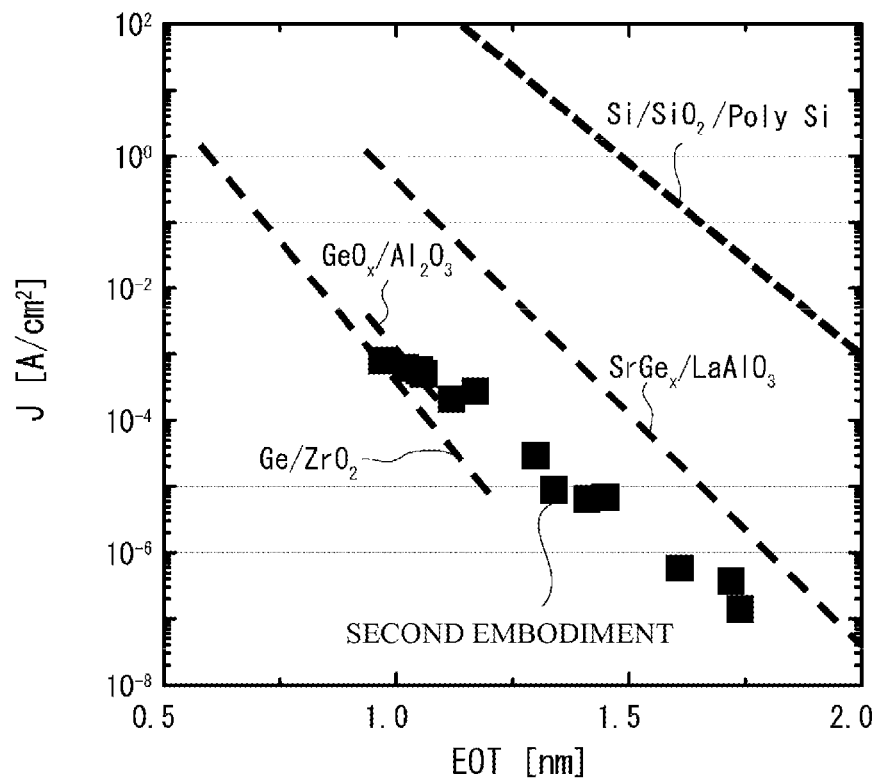
FIG. 11B illustrates a leak current density J with respect to an EOT.

FIG. 11B illustrates the leak current density J with respect to the EOT. In FIG. 11B, dots indicate the results of the second embodiment. Broken lines indicate the results with respect to zirconium oxide ($ZrO_2$) on germanium (Ge), aluminum oxide ($Al_2O_3$) on germanium oxide ($GeO_2$), lanthanum aluminum oxide ($LaAlO_3$) on strontium germanium ($SrGe_x$) and silicon oxide ($SiO_2$) on silicon (Si) using a gate electrode of poly-crystal silicon (Poly Si). As illustrated in FIG. 11B, in the second embodiment, the leak current is smaller than that of the silicon oxide film. In the second embodiment, the leak current is smaller than in other embodiments. Even if the EOT is 1 nm, the leak current density J can be approximately $1 \times 10^{-3}$ A/cm². The leak current density of the second embodiment is $10^{-5 \times EOT+2}$ A/cm².

Next, a p-type germanium substrate was used as the germanium layer 30, an yttrium oxide film was used as the high dielectric oxide film 34, and a semiconductor structure was fabricated. The film thickness of the high dielectric oxide film 34 is 1.5 nm. The forming condition of the germanium oxide film 32 is that the oxygen pressure is 70 atmospheres and the substrate temperature is 500 degrees C. Samples having various EOTs were fabricated by changing the oxidation time. As comparative examples, samples that did not have the high dielectric oxide film 34 and had a germanium oxide film of which EOT was 10 nm were fabricated on the p-type germanium substrate.

Figure 12A:
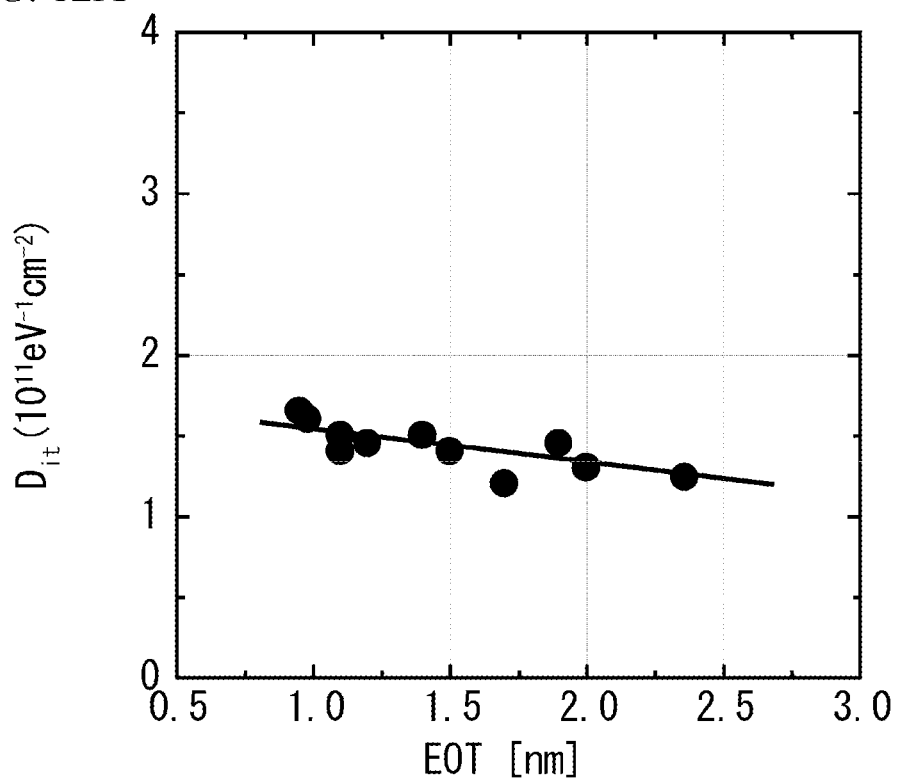
FIG. 12A illustrates an interface state density $D_{it}$ with respect to an EOT.
Figure 12B:
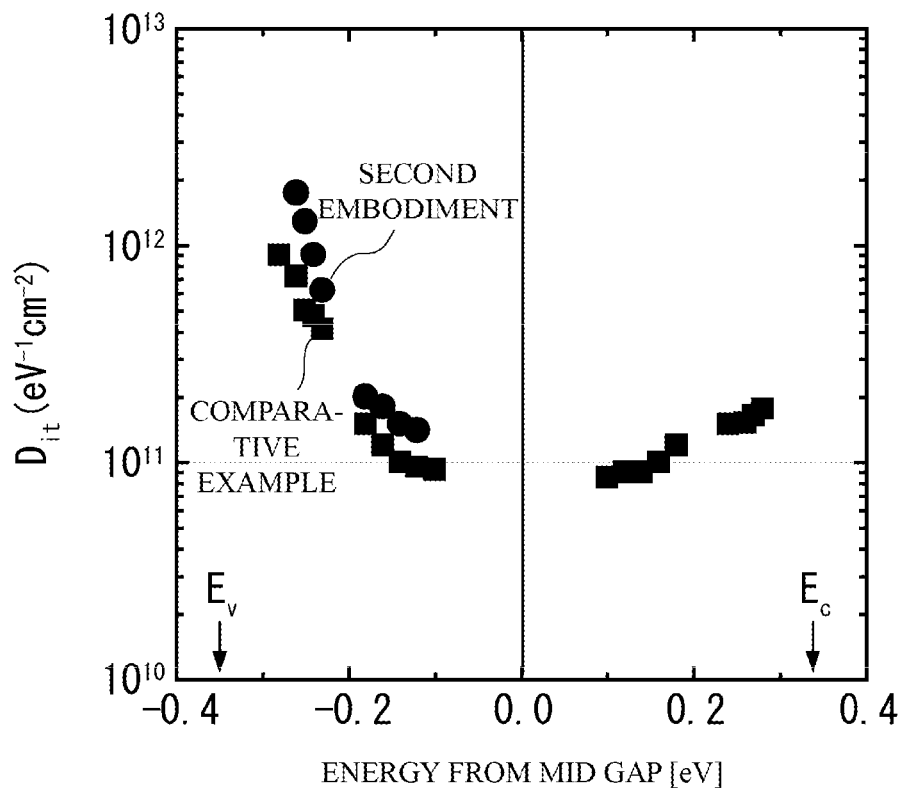
FIG. 12B illustrates an interface state density $D_{it}$ with respect to energy.

FIG. 12A illustrates an interface state density $D_{it}$ with respect to the EOT. FIG. 12B illustrates the interface state density $D_{it}$ with respect to the energy. The EOT and the interface state density were measured from the impedance measurements at 200K and 100K with use of a conductance method. In FIG. 12A, dots indicate an interface state density at −0.2 eV from the mid gap (a center energy of an energy band). A solid line indicates an approximation line. As illustrated in FIG. 12A, even if the EOT is 2 nm or less, the interface state density is $2 \times 10^{11}$ $eV^{-1}$ $cm^{-2}$ or less. In FIG. 12B, circle dots indicate the second embodiment in which the EOT is 1 nm. And square dots indicate the comparative example in which the EOT is 10 nm. $E_v$ indicates the energy of a top of a valence band. $E_c$ indicates bottom energy of a conduction band. Generally, when the EOT is small, the interface state density is large. The comparative example is a sample in which the interface state density is greatly reduced by enlarging the EOT. As illustrated in FIG. 12B, even if the EOT is 1 nm, the second embodiment has an interface state density that is not inferior to that of the comparative example of which EOT is 10 nm.

In the second embodiment, as illustrated in FIG. 11B, the EOT of the insulating film 33 can be 2 nm or less. And, when a metal film is formed on the insulating film 33, a leak current density can be $10^{-5 \times EOT+4}$ $A/cm^2$ or less in a case where the voltage V of the metal film 36 with respect to the germanium layer 30 is −1 V from the flat band voltage. It is preferable that the EOT is 1.5 nm or less. It is more preferable that the EOT is 1.2 nm or less. It is much more preferable that the EOT is 1.0 nm or less. It is preferable that the leak current density is $10^{-5 \times EOT+3}$ $A/cm^2$ or less. It is more preferable that leak current density is $1 \times 10^{-2}$ $A/cm^2$ or less. It is much more preferable that the leak current density is $1 \times 10^{-3}$ $A/cm^2$ or less and $1 \times 10^{-4}$ $A/cm^2$ or less. When the forming of the germanium oxide film 32 of FIG. 9C is not performed after forming the high dielectric oxide film 34, the leak current is very large in a case where the EOT is 2 nm or less. In this case, when the EOT is 2 nm or less, it is not possible to reduce the leak current less than the silicon oxide on the silicon substrate having the poly-crystal silicon acting as the gate electrode.

When the p-type germanium was used, the leak current density in a case where the voltage of the metal film with respect to the germanium layer was −1 V from the flat band voltage was used for the comparison. However, when the n-type germanium is used, the leak current density in a case where the voltage of the metal film with respect to the germanium layer is 1V from the flat band voltage is used for the comparison. That is, the leak current density for the comparison is the voltage in a case where the voltage of the metal film with respect to the germanium layer is applied to the accumulation region side from the flat band voltage by 1 V.

Figure 13A:
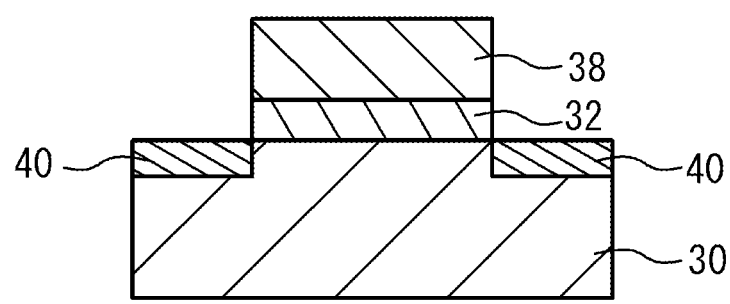
FIG. 13A illustrates a cross sectional view of a transistor having a semiconductor structure of a first embodiment.
Figure 13B:
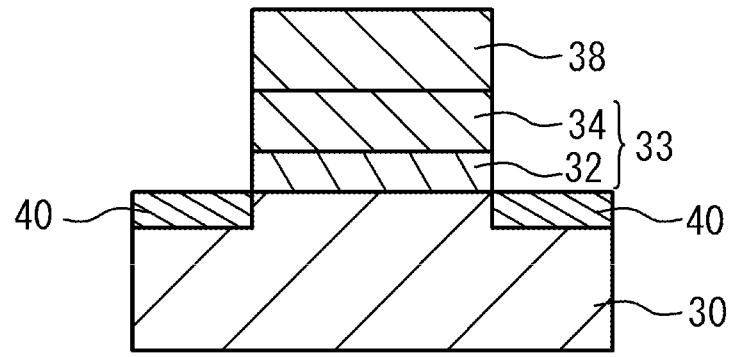
FIG. 13B illustrates a cross sectional view having a semiconductor structure of a second embodiment.

FIG. 13A illustrates a cross sectional view of a transistor having the semiconductor structure of the first embodiment. FIG. 13B illustrates a cross sectional view having the semiconductor structure of the second embodiment. As illustrated in FIG. 13A, a gate electrode 38 is formed on the germanium oxide film 32 above the germanium layer 30. A source or drain region 40 is formed in the germanium layers 30 on the both sides of the gate electrode 38. The germanium layer 30 is a p-type. The source or drain region 40 is an n-type. The germanium layer 30 may be an n-type and the source or drain region 40 may be a p-type.

As illustrated in FIG. 13B, the high dielectric oxide film 34 is formed between the germanium oxide film 32 and the gate electrode 38. Other structures are the same as FIG. 13A. Therefore, an explanation of the structures is omitted. As in the case of the transistors of FIG. 13A and FIG. 13B, when the germanium oxide film 32 or the insulating film 33 is used as a gate insulating film, it is possible to achieve a MOSFET in which the EOT of the gate insulating film is small and the interface condition between the gate insulating film and the semiconductor layer is preferable.

A FET was fabricated with use of the semiconductor structure of the second embodiment. A p-type germanium substrate was used as the germanium layer 30. A yttrium oxide film was used as the high dielectric oxide film 34. The film thickness of the high dielectric oxide film 34 is 1.5 nm. The forming condition of the germanium oxide film 32 is that the oxygen pressure is 70 atmospheres and the substrate temperature is 500 degrees C. Samples having various EOTs were made by changing the oxidation time. Samples that do not have the high dielectric oxide film 34 and has a germanium oxide film having the EOT of 10 nm on a p-type germanium substrate were made as FETs of comparative examples. A gate length was 100 µm. A gate width was 25 µm. A split CV method was used. The number of carriers and a mobility $\mu_{eff}$ at room temperature were measured. The split CV method is a method in which the number of carriers are calculated from an integration of the CV measurement and the mobility is calculated from the number of carriers and the I-V measurement.

Figure 14A:
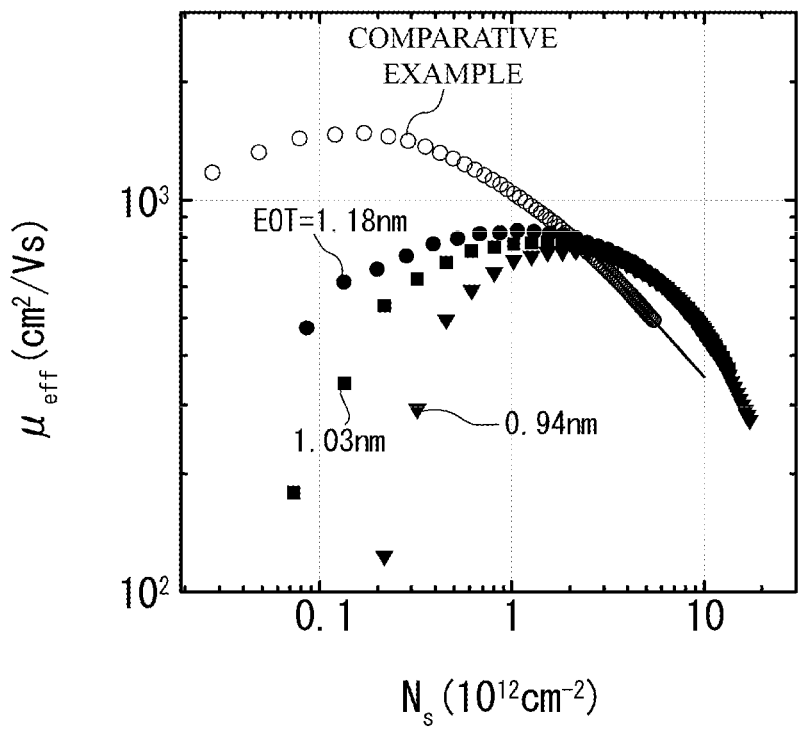
FIG. 14A and FIG. 14B illustrate a mobility $\mu_{eff}$ with respect to a face electron density $N_s$.
Figure 14B:
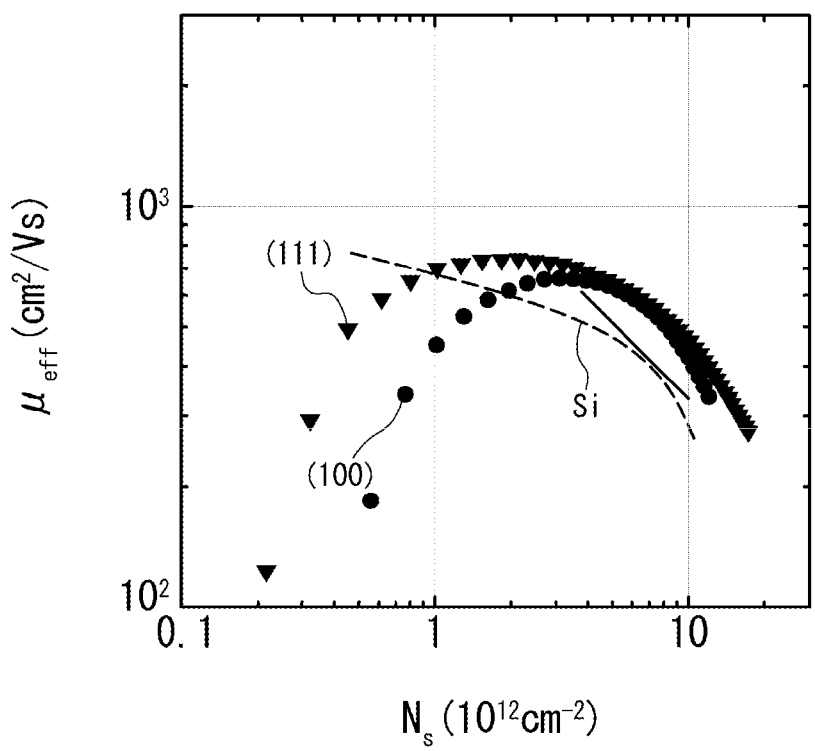

FIG. 14A and FIG. 14B illustrate the mobility $\mu_{eff}$ with respect to a face electron density $N_s$. The face electron density $N_s$ was changed by applying a gate voltage to the gate electrode. And the mobility $\mu_{eff}$ was measured. FIG. 14A illustrates the samples of the second embodiment of which EOT is 1.18 nm, 1.03 nm and 0.94 nm and measurement results of the comparative examples. The main face of the germanium substrate is a (111) face. As illustrated in FIG. 14A, when the face electron density is $3 \times 10^{12}$ $cm^{-2}$ or more, the mobility of the second embodiment is larger than that of the comparative example. A solid line indicates a straight line in which data of the comparative example in which the face electron density is $3 \times 10^{12}$ $cm^{-2}$ or more and $5 \times 10^{12}$ $cm^{-2}$ or less are extrapolated.

FIG. 14B illustrates measurement results of the samples in which the main faces of the germanium substrates are a (111) face and a (100) face. The EOT of the measured samples is 0.94 nm. A broken line indicates a general mobility of a silicon MOSFET. A solid line is a straight line in which data of the comparative example in which the face electron density is $3 \times 10^{12}$ $cm^{-2}$ or more and $5 \times 10^{12}$ $cm^{-2}$ or less are extrapolated. As illustrated in FIG. 14B, in the MOSFET using germanium, the mobility in a region having a small face electron density ($3 \times 10^{12}$ cm−2 or less) is larger than that of the silicon MOSFET. However, the mobility is approximately the same as that of the silicon MOSFET in a region having a large face electron density ($5 \times 10^{12}$ $cm^{-2}$ or more). In the embodiments, it is possible to enlarge the mobility mode than that of the silicon MOSFET when the face electron density $N_s$ is $5 \times 10^{12}$ $cm^{-2}$ or more.

As mentioned above, in the FET having the semiconductor structure of the second embodiment, the mobility $\mu_{eff}$ can be within a range of the following inequality when the face electron density $N_s$ is $5 \times 10^{12}$ $cm^{-2}$ or more.

$$Log_{10}\mu_{eff} > -0.59 \times log_{10} N_s + 10.19$$

The mobility within the range could not be achieved in a MOSFET having a germanium layer until now. The mobility can be achieved for the first time when the semiconductor structure of the second embodiment is used.

It is preferable that the mobility $\mu_{\mathit{eff}}$ is within $\log_{10}\mu_{\mathit{eff}} > -0.59 \times \log_{10}N_s + 10.3$ when the face electron density Ns is $5 \times 10^{12}$ cm$^{-2}$ or more. It is more preferable that the mobility $\mu_{\mathit{eff}}$ is within $\log_{10}\mu_{\mathit{eff}} > -0.59 \times \log_{10}N_s + 10.5$ when the face electron density Ns is $5 \times 10^{12}$ cm$^{-2}$ or more.

The semiconductor structures of the first and second embodiments can be applied to a semiconductor device other than the MOSFET.

Although preferred embodiments of the present invention have been described so far, the present invention is not limited to those particular embodiments, and various changes and modifications may be made to them within the scope of the invention claimed herein.

DESCRIPTION OF REFERENCE NUMERALS

10 germanium substrate
12, 32 germanium oxide film
14, 16, 36 metal film
30 germanium layer
34 high dielectric oxide film
38 gate electrode
40 source or drain region

The invention claimed is:
1. A semiconductor structure comprising:
a germanium layer that is p-type;
an insulating film that has a film that comprises germanium oxide and is formed on the germanium layer;
a high dielectric oxide film that is formed on the film including the germanium oxide and has a dielectric constant higher than that of a silicon oxide; and
a metal film comprising gold that is formed on the insulating film,
wherein:
an EOT of the insulating film is 2 nm or less; and
a leak current density is $10^{-5 \times EOT + 4}$ A/cm$^2$ or less when a voltage of the metal film with respect to the germanium layer is applied from a flat band voltage to an accumulation region side by 1 V,
wherein $\log_{10}\mu_{\mathit{eff}}$ (cm$^2$/V·s) is more than $-0.59 \times \log_{10}N_s + 10.19$ when $N_s$ is $5 \times 10^{12}$ cm$^{-2}$ or more, a face electron density in the germanium layer is $N_s$ (cm$^{-2}$) and an electron mobility of the germanium layer obtained by a split CV method is $\mu_{\mathit{eff}}$ (cm$^2$/V·s).
2. A semiconductor structure comprising:
a germanium layer that is p-type;
an insulating film that has a film that comprises germanium oxide and is formed on the germanium layer;
a high dielectric oxide film that is formed on the film including the germanium oxide and has a dielectric constant higher than that of a silicon oxide; and
a metal film that is formed on the insulating film,
wherein:
an EOT of the insulating film is 2 nm or less; and
a leak current density is $10^{-5 \times EOT + 4}$ A/cm$^2$ or less when a voltage of the metal film with respect to the germanium layer is applied from a flat band voltage to an accumulation region side by 1 V,
wherein $\log_{10}\mu_{\mathit{eff}}$ (cm$^2$/V·s) is more than $-0.59 \times \log_{10}N_s + 10.19$ when $N_s$ is $5 \times 10^{12}$ cm$^{-2}$ or more, a face electron density in the germanium layer is $N_s$ (cm$^{-2}$) and an electron mobility of the germanium layer obtained by a split CV method is $\mu_{\mathit{eff}}$ (cm$^2$/V·s).
3. The semiconductor structure of claim 2, wherein a capacitance value between the germanium layer and the metal film at a frequency of 50 kHz or more decreases evenly or is constant when the voltage of the metal film with respect to the germanium layer changes from the flat band voltage to an inversion region.
4. The semiconductor structure of claim 2, wherein $\log_{10}\mu_{\mathit{eff}}$ is more than $-0.59 \times \log_{10}N_s + 10.19$ when $N_s$ is $1 \times 10^{13}$ cm$^{-2}$ or more.
5. A semiconductor structure comprising:
a germanium layer;
a germanium oxide film that is formed on the germanium layer, has a density of 3.73 g/cm$^3$ or more and has an EOT of 2 nm or less; and
a gate electrode that is formed in contact with the germanium oxide film.
6. The semiconductor structure as claimed in claim 5, wherein a metal film comprises gold and a capacitance value between the germanium layer and the metal film at a frequency of 50 kHz or more decreases evenly or is constant when a voltage of the metal film with respect to the germanium layer changes from a flat band voltage to an inversion region.
7. The semiconductor structure of claim 5, wherein a film thickness of the germanium oxide film is 1.2 nm or less.
8. The semiconductor structure of claim 2, wherein the high dielectric oxide film includes at least one of a zirconium oxide, an yttrium oxide, a scandium oxide, and an oxide of a rare earth element.
9. The semiconductor structure of claim 2, wherein the metal film is a gate electrode.
10. The semiconductor structure of claim 2, wherein the high dielectric oxide film includes at least one of a hafnium oxide film, a zirconium oxide film, an aluminum oxide film, an yttrium oxide film, a scandium oxide film and an oxide film of a rare earth element.

* * * * *